United States Patent
Kanemura et al.

(10) Patent No.: US 11,101,131 B2
(45) Date of Patent: Aug. 24, 2021

(54) FILM FORMING METHOD AND FILM FORMING APPARATUS

(71) Applicant: TOKYO ELECTRON LIMITED, Tokyo (JP)

(72) Inventors: Rui Kanemura, Yamanashi (JP); Hiroyuki Hayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/540,347

(22) Filed: Aug. 14, 2019

(65) Prior Publication Data
US 2020/0058504 A1 Feb. 20, 2020

(30) Foreign Application Priority Data
Aug. 17, 2018 (JP) .............................. JP2018-153703

(51) Int. Cl.
| | | |
|---|---|---|
| *H01L 21/033* | (2006.01) | |
| *C23C 16/34* | (2006.01) | |
| *H01L 21/3213* | (2006.01) | |
| *C23C 16/56* | (2006.01) | |
| *C23C 16/458* | (2006.01) | |
| *C23C 16/40* | (2006.01) | |
| *H01L 21/3205* | (2006.01) | |

(52) U.S. Cl.
CPC ........ *H01L 21/0338* (2013.01); *C23C 16/345* (2013.01); *C23C 16/401* (2013.01); *C23C 16/4584* (2013.01); *C23C 16/56* (2013.01); *H01L 21/0332* (2013.01); *H01L 21/0335* (2013.01); *H01L 21/0337* (2013.01); *H01L 21/32055* (2013.01); *H01L 21/32135* (2013.01)

(58) Field of Classification Search
None
See application file for complete search history.

(56) References Cited

U.S. PATENT DOCUMENTS

| | | | | |
|---|---|---|---|---|
| 2011/0263105 | A1* | 10/2011 | Hasebe | ............ H01L 21/76843 |
| | | | | 438/482 |
| 2012/0028437 | A1* | 2/2012 | Watanabe | ......... H01L 21/02323 |
| | | | | 438/425 |
| 2017/0178899 | A1* | 6/2017 | Kabansky | ......... H01L 21/02211 |

FOREIGN PATENT DOCUMENTS

JP 2010103242 A 5/2010

* cited by examiner

*Primary Examiner* — Robert P Culbert
(74) *Attorney, Agent, or Firm* — Nath, Goldberg & Meyer; Jerald L. Meyer (57) ABSTRACT

A method of selectively forming a silicon film on an upper portion of each of protruded portions formed on a substrate, which includes: supplying a first silicon-containing gas to the substrate and forming a first silicon film so that a film thickness of the first silicon film becomes thicker in the upper portion rather than in a lower portion of a sidewall of each protruded portion; subsequently, supplying an etching gas to the substrate and removing the first silicon film on the sidewall of each protruded portion while leaving the first silicon film on an upper surface of each protruded portion; and subsequently, supplying a second silicon-containing gas to the substrate and forming a second silicon film so that a film thickness of the second silicon film becomes thicker in the upper portion rather than in the lower portion of a sidewall of each protruded portion.

11 Claims, 7 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2018-153703, filed on Aug. 17, 2018, the entire contents of which are incorporated herein by reference.

TECHNICAL FIELD

The present disclosure relates to a film forming method and a film forming apparatus.

BACKGROUND

There is known a method of forming a hole in a stacked film formed by alternately stacking silicon oxides and silicon nitrides on a silicon layer by lithography and etching, and forming a trench in the silicon layer using the hole as a mask (see, e.g., Patent Document 1).

There is a limit to the depth of the hole that is formed by one round of lithography and etching. Therefore, when forming a hole in a stacked film having the number of stacked layers exceeding the limit, the formation of the stacked film and the formation of the hole are repeatedly performed. When the formation of the stacked film and the formation of the hole are repeatedly performed, a silicon film is buried in a hole of a lower layer as an etching stopper when forming a hole of an upper layer. At this time, if the silicon film is completely buried in the lower hole, it takes a long period of time to remove the silicon film after the formation of the upper layer.

PRIOR ART DOCUMENT

Patent Documents

Patent Document 1: Japanese laid-open publication No. 2010-103242

SUMMARY

According to one embodiment of the present disclosure, there is provided a method of selectively forming a silicon film on an upper portion of each of a plurality of protruded portions formed on a substrate, the method including: a first film forming step of supplying a first silicon-containing gas to the substrate and forming a first silicon film so that a film thickness of the first silicon film becomes thicker in the upper portion of a sidewall of each of the plurality of protruded portions rather than in a lower portion of the sidewall of each of the plurality of protruded portions; an etching step of supplying an etching gas to the substrate and removing the first silicon film on the sidewall of each of the plurality of protruded portions while leaving the first silicon film on an upper surface of each of the plurality of protruded portions, the etching step being performed after the first film forming step; and a second film forming step of supplying a second silicon-containing gas to the substrate and forming a second silicon film so that a film thickness of the second silicon film becomes thicker in the upper portion of a sidewall of each of the plurality of protruded portions rather than in a lower portion of the sidewall of each of the plurality of protruded portions, the second film forming step being performed after the etching step.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film Forming Apparatus]

A film forming apparatus which can implement a film forming method according to one embodiment of the present disclosure will be described. An example may be a batch-type vertical heat treatment apparatus that performs heat treatment on a number of substrates in a collective manner. However, the film forming apparatus is not limited to the vertical heat treatment apparatus but may also be other various types of apparatuses. For example, the film forming apparatus may be a single wafer-type apparatus that processes substrates one by one. In some embodiments, the film forming apparatus may be a semi-batch-type apparatus for forming a film on each substrate by revolving the substrates disposed on a rotary table in a processing container with the rotary table, and sequentially passing each substrate through an area to which a precursor gas is supplied and an area to which a reaction gas that reacts with the precursor gas is supplied.

Figure 1:
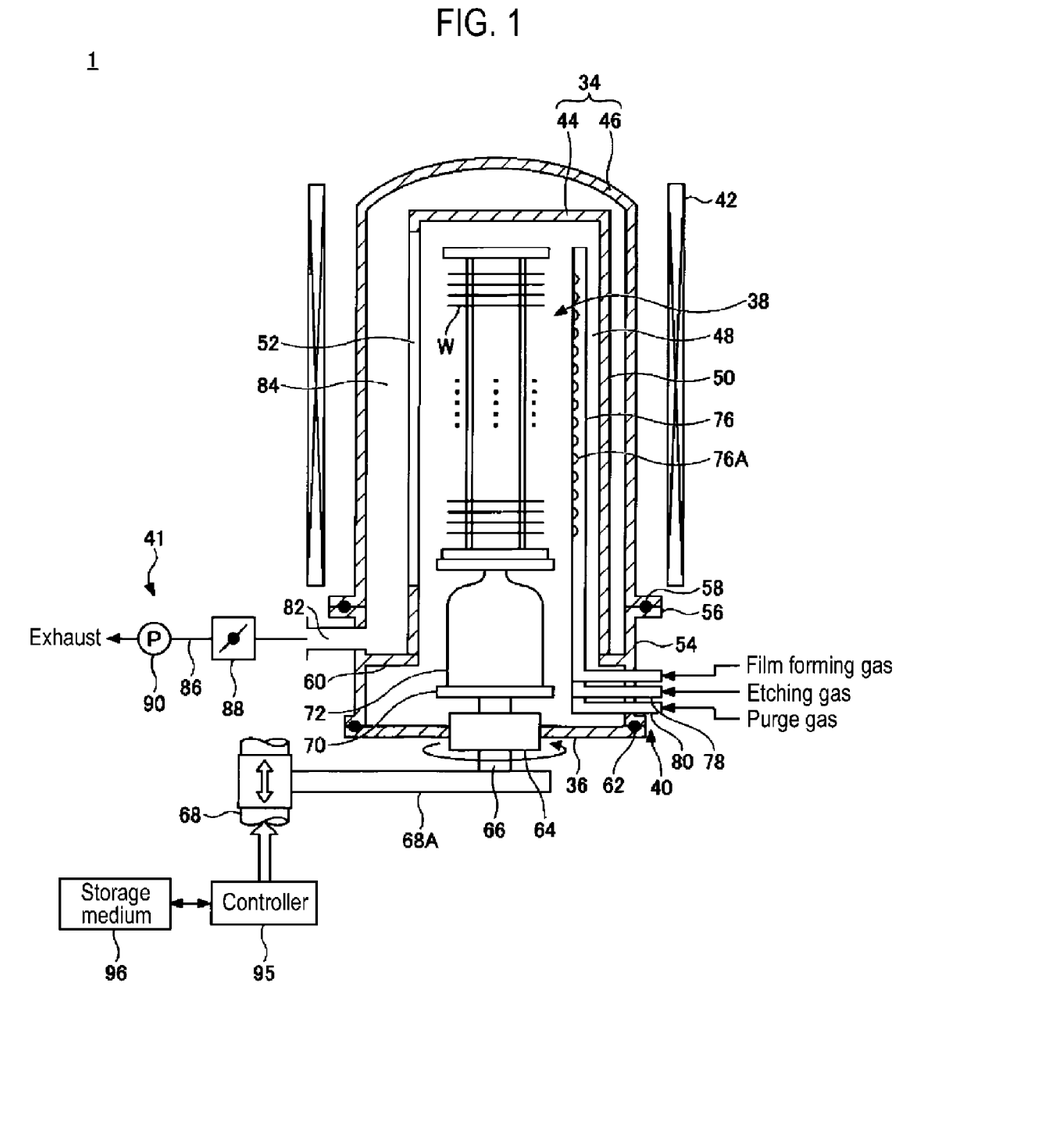
FIG. 1 is a schematic view showing an exemplary configuration of a film forming apparatus.
Figure 2:
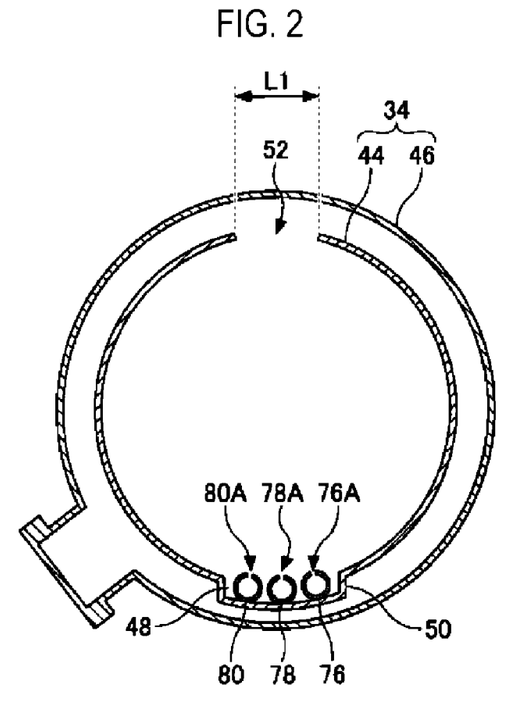
FIG. 2 is an explanatory view of a processing container of the film forming apparatus shown in FIG. 1.

FIG. 1 is a schematic view showing an exemplary configuration of a film forming apparatus. FIG. 2 is an explanatory view of a processing container of the film forming apparatus of FIG. 1.

As shown in FIG. 1, a film forming apparatus 1 includes a processing container 34 in which semiconductor wafers (hereinafter referred to as "wafers W") as substrates are accommodated.

The processing container 34 includes a roofed cylindrical inner tube 44 with its lower end opened, and a roofed cylindrical outer tube 46 with its lower end opened to surround the inner tube 44. The inner tube 44 and the outer tube 46 are made of a heat-resistant material such as quartz, and are arranged in a coaxial relationship with each other to have a double tube structure.

For example, a ceiling portion of the inner tube 44 is flat. A nozzle accommodation portion 48 in which gas supply pipes are accommodated is formed on one side of the inner tube 44 along a longitudinal direction (vertical direction) of the inner tube 44. For example, as shown in FIG. 2, a portion of the sidewall of the inner tube 44 protrudes outward to form a protruded portion 50. The inside of the protruded portion 50 is defined as the nozzle accommodation portion 48. A rectangular opening 52 having a width L1 is formed in the opposite sidewall of the inner tube 44 along the longitudinal direction (vertical direction) so as to face the nozzle accommodation portion 48.

The opening 52 is a gas exhaust port formed to exhaust a gas inside the inner tube 44 therethrough. A vertical length of the opening 52 may be the same as that of a wafer boat 38. Alternatively, the opening 52 may be formed to vertically extend so as to have a length longer than that of the wafer boat 38. That is to say, an upper end of the opening 52 extends to a height above a position corresponding to an upper end of the wafer boat 38, and a lower end of the opening 52 extends to a height below a position corresponding to a lower end of the wafer boat 38.

A lower end of the processing container 34 is supported by a cylindrical manifold 54 made of, e.g., stainless steel. A flange portion 56 is formed on an upper end of the manifold 54. A lower end of the outer tube 46 is disposed on and supported by the flange portion 56. A seal member 58 such as an O-ring is interposed between the flange portion 56 and the lower end of the outer tube 46 to make the inside of the outer tube 46 airtight.

An annular support portion 60 is formed on an upper inner wall of the manifold 54. A lower end of the inner tube 44 is disposed on and supported by the support portion 60. A lid 36 is air-tightly attached to a lower end opening of the manifold 54 via a seal member 62 such as an O-ring. Thus, a lower end opening of the processing container 34, namely the lower end opening of the manifold 54, is air-tightly sealed. The lid 36 may be made of stainless steel.

A rotary shaft 66 is provided in the central portion of the lid 36 so as to penetrate through a magnetic fluid seal part 64. A lower portion of the rotary shaft 66 is rotatably supported by an arm 68A of an elevation mechanism 68 including a boat elevator.

A rotary plate 70 is provided on an upper end of the rotary shaft 66. The wafer boat 38 for holding the wafers W is mounted on the rotary plate 70 via a quartz thermal insulation container 72. Therefore, with the vertical movement of the elevation mechanism 68, the lid 36 and the wafer boat 38 are moved up and down together so that the wafer boat 38 can be loaded into and unloaded from the processing container 34. The wafer boat 38 holds the number of wafers W at predetermined intervals.

A gas supply part 40 is provided in the manifold 54 and introduces a gas such as a film forming gas, an etching gas, a purge gas or the like into the inner tube 44. The gas supply part 40 includes a plurality of (e.g., three) quartz-made gas supply pipes 76, 78 and 80. Each of the gas supply pipes 76, 78 and 80 is provided inside the inner tube 44 along the longitudinal direction of the inner tube 44. A base end of each of the gas supply pipes 76, 78 and 80 is bent in an L-shape and supported so as to penetrate the manifold 54.

As shown in FIG. 2, the gas supply pipes 76, 78 and 80 are installed in a line along the circumferential direction inside the nozzle accommodation portion 48 of the inner tube 44. A plurality of gas holes 76A, 78A and 80A are formed in the respective gas supply pipes 76, 78 and 80 at predetermined intervals along the longitudinal direction of the gas supply pipes 76, 78 and 80, so that the respective gases can be ejected horizontally from the respective gas holes 76A, 78A and 80A. The predetermined interval may be set to be equal to an interval between the wafers W supported by the wafer boat 38. Further, a position in the height direction is set so that each of the gas holes 76A, 78A and 80A is located toward the middle between the wafers W adjacent to each other in the vertical direction, so that each gas can be efficiently supplied into a space between the wafers W. In one embodiment, the gas supply pipe 76 constitutes a film forming gas supply part for supplying a film forming gas. The gas supply pipe 78 constitutes an etching gas supply part for supplying an etching gas. The gas supply pipe 80 constitutes a purge gas supply part for supplying a purge gas. The film forming gas, the etching gas and the purge gas are supplied into the processing container 34 as necessary while controlling respective flow rates.

A gas outlet 82 is formed in an upper sidewall of the manifold 54 and above the support portion 60, so that a gas in the inner tube 44, which is discharged from the opening 52, can be exhausted through the gas outlet 82 via a space 84 between the inner tube 44 and the outer tube 46. An exhaust part 41 is provided at the gas outlet 82. The exhaust part 41 includes an exhaust passage 86 connected to the gas outlet 82. A pressure regulating valve 88 and a vacuum pump 90 are sequentially installed in the exhaust passage 86 to evacuate the inside of the processing container 34.

A cylindrical heater 42 is provided at the outer peripheral side of the outer tube 46 so as to surround the outer tube 46. The heater 42 heats the wafers W accommodated in the processing container 34.

The operation of each part of the film forming apparatus 1 may be controlled by a controller 95 such as a computer. Further, a computer program that controls the operation of each part of the film forming apparatus 1 is stored in a storage medium 96. Examples of the storage medium 96 may include a flexible disk, a compact disk, a hard disk, a flash memory, a DVD, and the like.

[Film Forming Method]

First Embodiment

A film forming method according to a first embodiment will be described with a case in which an amorphous silicon film (hereinafter referred to as a "silicon film") is selectively formed on an upper surface of each of a plurality of protruded portions formed on a substrate by the above-described film forming apparatus 1. The film forming method described later is executed by the controller 95 controlling the operation of each part of the film forming apparatus 1. FIGS. 3A to 3G are process sectional views showing the film forming method according to the first embodiment.

Figure 3A:
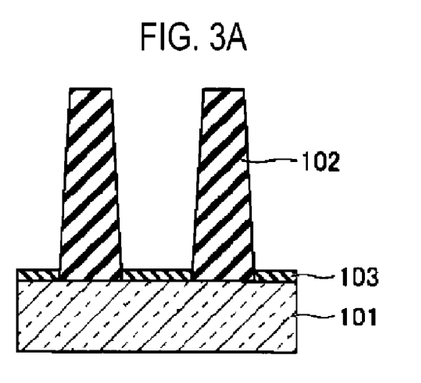
FIGS. 3A to 3G are process sectional views showing a film forming method according to a first embodiment.

First, as shown in FIG. 3A, a substrate 101 having a plurality of protruded portions 102 formed on its front surface is prepared (in a preparation step). The substrate 101 may be a semiconductor wafer such as a silicon wafer. For example, a surface oxide film 103 is formed on the front surface of the substrate 101. The protruded portion 102 may be a single layer film or a stacked film. The stacked film may be a film obtained by stacking silicon-containing films having different compositions one above another. For example, the stacked film may have an ONON stacked structure in which silicon oxides ($SiO_2$) and silicon nitrides (SiN) are alternately stacked one above the other, or an OPOP stacked structure in which silicon oxides ($SiO_2$) and polysilicons are alternately stacked one above the other.

Subsequently, the substrate 101 is loaded into the processing container 34 (in a loading step). In one embodiment, first, the wafer boat 38 that holds the number of substrates 101 is loaded into the processing container 34 by the elevation mechanism 68, and the lower end opening of the processing container 34 is air-tightly closed and sealed by the lid 36. Subsequently, the processing container 34 is evacuated by the exhaust part 41 so that an internal pressure of the processing container 34 becomes a predetermined pressure, and the substrates 101 are heated by the heater 42.

Figure 3B:
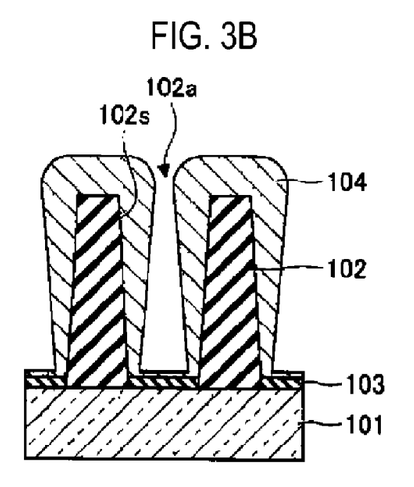

Subsequently, a silicon-containing gas (a first silicon-containing gas) is supplied from the gas supply pipe 76 into the processing container 34 while rotating the wafer boat 38. As a result, as shown in FIG. 3B, a silicon film 104 (a first silicon film) is formed so that a film thickness of the silicon film 104 becomes thicker in an upper portion of the sidewall 102s of the protruded portion 102 rather than in a lower portion of the sidewall 102s thereof (in a first film forming step). In the first film forming step, the silicon film 104 may be formed so as not to close an opening 102a formed by the protruded portions 102 adjacent to each other. This allows an etching gas to reach the bottom of the opening 102a in order to perform conformal etching in a subsequent etching step. The silicon-containing gas may be any gas as long as it can form the silicon film 104 in which a film thickness in the upper portion of the sidewall 102s of the protruded portion 102 becomes thicker than that in the lower portion of the sidewall 102s thereof. For example, the silicon-containing gas may be a high-order silane-based gas containing two or more silicon (Si) atoms in its molecular formula. The high-order silane-based gas may be a disilane ($Si_2H_6$) gas, a trisilane ($Si_3H_8$) gas or a tetrasilane ($Si_4H_{10}$) gas.

Figure 3C:
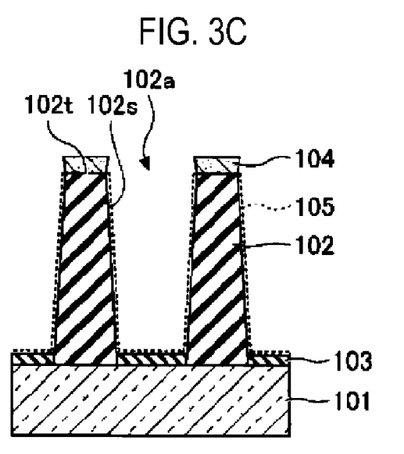

Subsequently, the etching gas is supplied from the gas supply pipe 78 into the processing container 34 while rotating the wafer boat 38. As a result, as shown in FIG. 3C, the silicon film 104 on the sidewall 102s of the protruded portion 102 is removed while leaving the silicon film 104 on an upper surface 102t of the protruded portion 102 (in an etching step). At this time, halogens 105 contained in the etching gas is adsorbed onto the sidewall 102s of the protruded portion 102 that is exposed by removing the silicon film 104, and the upper surface of the surface oxide film 103. The etching gas may be any gas as long as it can leave the silicon film 104 on the upper surface 102t of the protruded portion 102 and remove the silicon film 104 on the sidewall 102s of the protruded portion 102. The etching gas may be a bromine-containing gas or an iodine-containing gas, which can be used to etch the silicon film 104 in a conformal manner. As a result, the silicon film 104 having a relatively thick thickness, which is formed on the upper surface 102t of the protruded portion 102, can remain. On the other hand, the silicon film 104 having a relatively thin thickness, which is formed on the sidewall 102s of the protruded portion 102, can be removed. The bromine-containing gas may be a hydrogen bromide (HBr) gas or a bromine ($Br_2$) gas. The iodine-containing gas may be a hydrogen iodide (HI) gas or an iodine ($I_2$) gas.

Figure 3D:
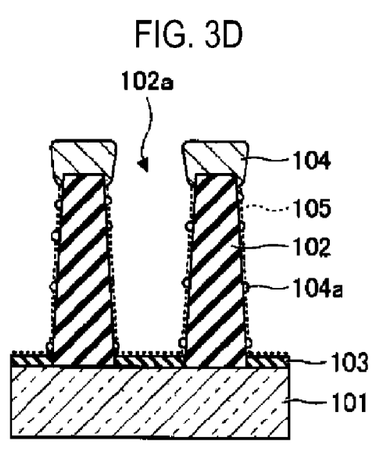
Figure 3E:
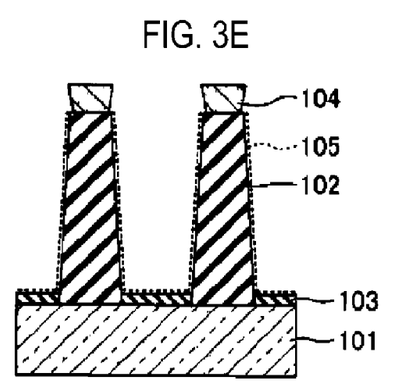
Figure 3F:
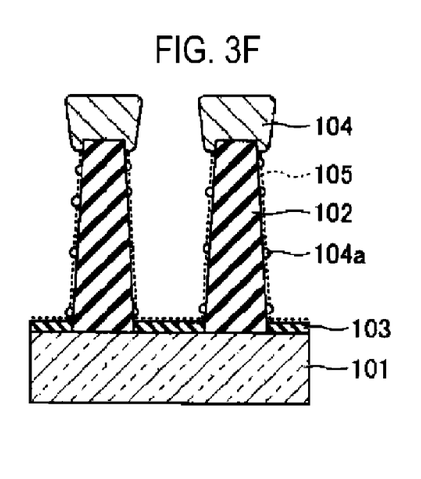
Figure 3G:
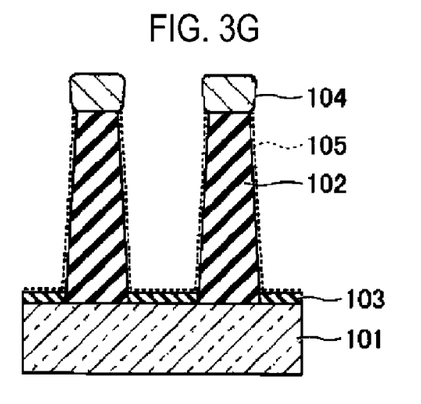

Subsequently, a silicon-containing gas (a second silicon-containing gas) is supplied from the gas supply pipe 76 into the processing container 34 while rotating the wafer boat 38. As a result, as shown in FIG. 3D, a silicon film 104 (a second silicon film) is additionally formed on the upper surface 102t of the protruded portion 102 (in a second film forming step). In the second film forming step, the silicon film 104 is hard to form on the sidewall 102s of the protruded portion 102 and the upper surface of the surface oxide film 103 due to halogens 105 adsorbed onto the sidewall 102s of the protruded portion 102 and the upper surface of the surface oxide film 103. As a result, the formation of the silicon film 104 on the front surface of the silicon film 104 which remains on the upper surface 102t of the protruded portion 102 progresses rapidly. Thus, the silicon film 104 is selectively formed on the upper surface 102t of the protruded portion 102. In the second film forming step, for example, the silicon film 104 is formed so as not to close the opening 102a formed by the protruded portions 102 adjacent to each other. Further, in the second film forming step, the supply of the silicon-containing gas is continued until film formation is started on, for example, the sidewall 102s of the protruded portion 102 and the upper surface of the surface oxide film 103. The expression "film formation is started" means a point of time at which silicon nuclei 104a are generated and before nuclear growth begins. The silicon-containing gas may be the same gas as in the first film forming step. In addition, the silicon-containing gas may be different from that used in the first film forming step, and may be a monosilane ($SiH_4$) gas.

Subsequently, the etching process and the second film forming process are alternately repeated a predetermined number of times to form a silicon film 104 (a third silicon film) having a predetermined film thickness on the upper surface 102t of the protruded portion 102. In one embodiment, the etching step (see FIG. 3E), the second film forming step (see FIG. 3F) and the etching step (see FIG. 3G) are performed in this order.

In this manner, the silicon film 104 can be selectively formed on the upper surface 102t of each of the plurality of protruded portions 102 formed on the substrate 101.

In some embodiments, before the first film forming step, while rotating the wafer boat 38, an aminosilane-based gas may be supplied from the gas supply pipe 76 into the processing container 34 to perform a seed lay forming step of forming a seed layer on the protruded portion 102. By performing the seed layer forming step before the first film forming step, a surface roughness of the silicon film 104 formed on the front surface of the protruded portion 102 can be reduced. A DIPAS (diisopropylaminosilane), a 3DMAS (trisdimethylaminosilane) or a BTBAS (bistertialbutylaminosilane) may be used as the aminosilane-based gas.

Second Embodiment

A film forming method according to a second embodiment will be described. The film forming method according to the second embodiment is a method of selectively forming a silicon film on an upper portion (upper surface, and upper portion of sidewall) of each of a plurality of protruded portions formed on a substrate, and closing an opening formed between adjacent protruded portions. The film forming method described later is executed by the controller 95 controlling the operation of each part of the film forming apparatus 1. FIGS. 4A to 4D are process sectional views showing the film forming method according to the second embodiment.

Figure 4A:
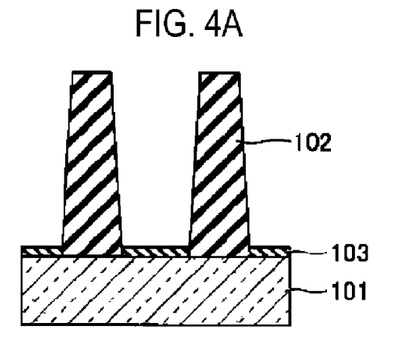
FIGS. 4A to 4D are process sectional views showing a film forming method according to a second embodiment.

First, as shown in FIG. 4A, a substrate 101 having a plurality of protruded portions 102 formed on its front surface is prepared (in a preparation step). This step may be the same as that of the first embodiment.

Subsequently, the substrate 101 is loaded into the processing container 34 (in a loading step). This step may be the same as that of the first embodiment.

Figure 4B:
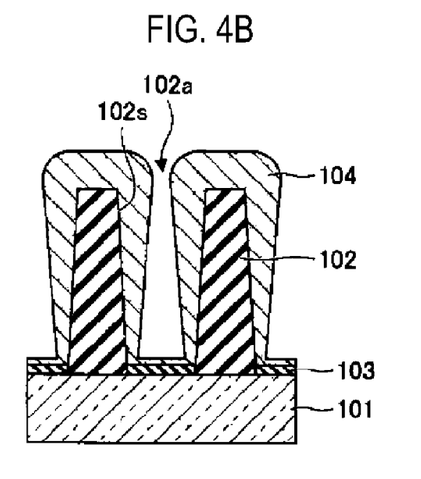

Subsequently, a silicon-containing gas is supplied from the gas supply pipe 76 into the processing container 34 while rotating the wafer boat 38. As a result, as shown in FIG. 4B, a silicon film 104 is formed so that a film thickness of the silicon film 104 becomes thicker in the upper portion of the sidewall 102s of the protruded portion 102 rather than in the lower portion of the sidewall 102s thereof (in a first film forming step). The first film forming step may be the same as that of the first embodiment.

Figure 4C:
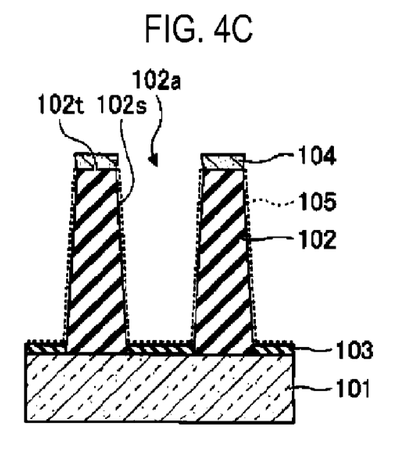

Subsequently, an etching gas is supplied from the gas supply pipe 78 into the processing container 34 while rotating the wafer boat 38. As a result, as shown in FIG. 4C, the silicon film 104 on the sidewall 102s of the protruded portion 102 is removed while leaving the silicon film 104 on the upper surface 102t of the protruded portion 102 (in an etching step). The etching step may be the same as that of the first embodiment.

Figure 4D:
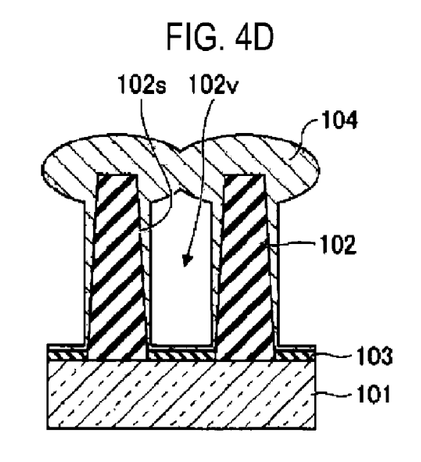

Subsequently, a silicon-containing gas is supplied from the gas supply pipe 76 into the processing container 34 while rotating the wafer boat 38. As a result, as shown in FIG. 4D, the silicon film 104 is formed so that a film thickness of the silicon film 104 becomes thicker in the upper portion of the sidewall 102s of the protruded portion 102 rather than that in the lower portion of the sidewall 102s thereof (in a second film forming step). In the second film forming step, the silicon film 104 is hard to be formed on the sidewall 102s of the protruded portion 102 and the upper surface of the surface oxide film 103 due to halogens adsorbed onto the sidewall 102s of the protruded portion 102 and the upper surface of the surface oxide film 103. As a result, the formation of the silicon film 104 on the front surface of the silicon film 104 which remains on the upper surface 102t of the protruded portion 102 progresses rapidly. Thus, the silicon film 104 is selectively formed on the upper surface 102t of the protruded portion 102. In the second film forming step, the silicon film 104 is formed so as to close the opening 102a formed between the protruded portions 102 adjacent to each other. As a result, a silicon film is selectively formed on the upper surface 102t and the upper portion of the sidewall 102s of the protruded portion 102, and a cavity 102v is formed between the protruded portions 102 adjacent to each other. The silicon-containing gas may be the same gas as that used in the first film forming step. In addition, the silicon-containing gas may be different from that used in the first film forming step. As an example, the silicon-containing gas may be a monosilane ($SiH_4$) gas.

In this manner, the silicon film can be selectively formed on the upper surfaces 102t and the upper portions of the sidewall 102s of the protruded portion 102.

Next, an application example of the film forming method according to the second embodiment will be described. Hereinafter, a method of forming a hole by lithography and etching in an ONON stacked structure in which silicon oxides and silicon nitrides are alternately stacked one above the other will be described.

Conventionally, in a case of forming a hole in an ONON stacked structure in which silicon oxides and silicon nitrides are alternately stacked one above the other, after a stacked film having a desired number of stacked layers is formed, a hole penetrating through all the layers is formed at once by lithography and etching.

However, there is a limit to the depth of the hole that can be opened by one round of lithography and etching. Thus, in a case of forming a hole in a stacked film that exceeds the number of stacked layers, formation of the stacked film and formation of the hole are repeatedly performed. When the formation of the stacked film and the formation of the hole are repeatedly performed, a silicon film is buried in a hole of the lower layer as an etching stopper when a hole of the upper layer is formed. However, when the silicon film is completely buried in the hole of the lower layer, it is difficult to remove the silicon film after forming the upper layer.

Therefore, the silicon film is formed as the etching stopper by the film forming method according to the second embodiment so that a cavity is formed inside the hole. Thus, the silicon film can be easily removed after the upper layer is formed.

Hereinafter, specific description will be given with reference to FIGS. 5A to 5F. FIGS. 5A to 5F are process sectional views showing an application example of the film forming method according to the second embodiment.

Figure 5A:
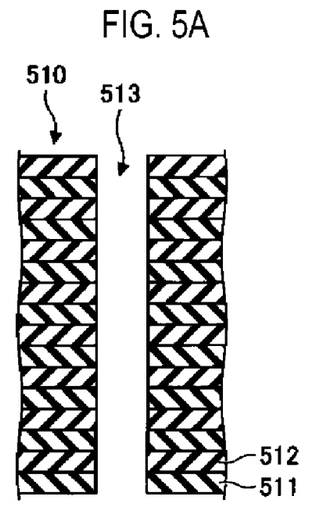
FIGS. 5A to 5F are process sectional views showing an application example of the film forming method according to the second embodiment.

First, as shown in FIG. 5A, silicon oxides 511 and silicon nitrides 512 are alternately stacked one above another to form an ONON stacked structure (hereinafter referred to as a "lower layer 510"). Substantially, a hole 513 penetrating through the lower layer 510 is formed by photolithography and etching.

Figure 5B:
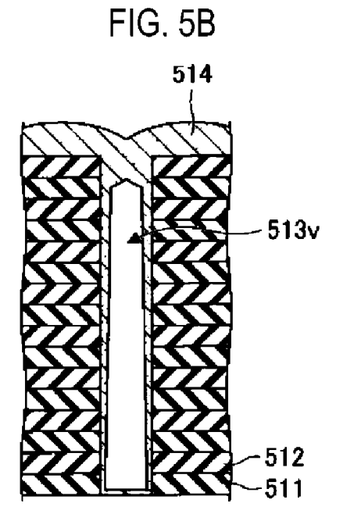

Subsequently, as shown in FIG. 5B, a silicon film 514 as an etching stopper is selectively formed on an upper portion of the lower layer 510 (an upper surface of the lower layer 510 and an upper portion of the hole 513) by the film forming method according to the second embodiment, and the hole 513 is closed. At this time, a cavity 513v is formed inside the hole 513.

Figure 5C:
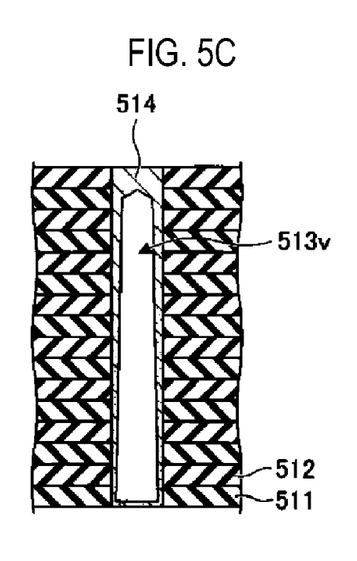

Subsequently, as shown in FIG. 5C, the silicon film 514 formed on the upper surface of the lower layer 510 is removed by etching.

Figure 5D:
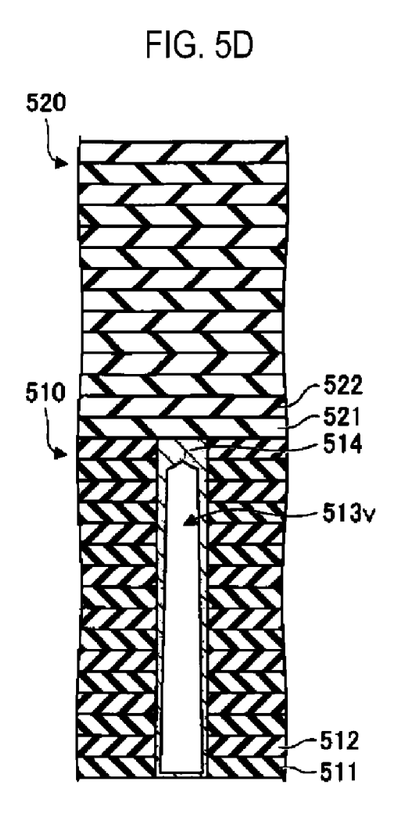

Subsequently, as shown in FIG. 5D, silicon oxides 521 and silicon nitrides 522 are alternately stacked on the lower layer 510 to form an ONON stacked structure (hereinafter referred to as an "upper layer 520").

Figure 5E:
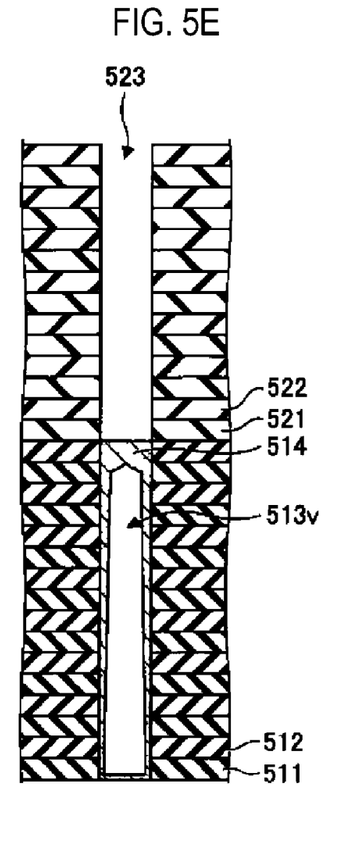

Subsequently, as shown in FIG. 5E, a hole 523 penetrating through the upper layer 520 is formed by photolithography and etching.

Figure 5F:
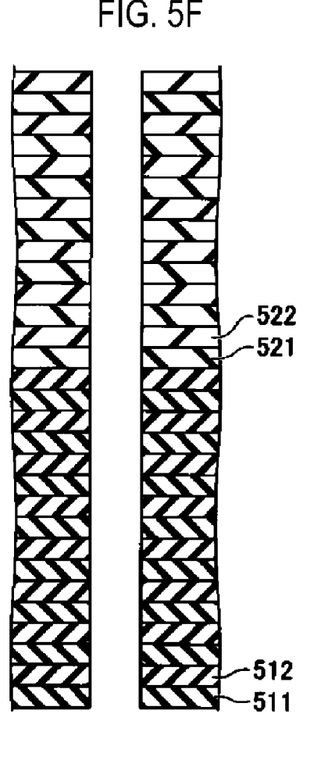

Subsequently, as shown in FIG. 5F, the silicon film 514 formed in the hole 513 of the lower layer 510 is removed by, for example, wet etching. It is therefore possible to form the holes 513 and 523 in the ONON stacked structure having a desired number of stacked layers so as to penetrate through the ONON stacked structure. At this time, since the silicon film 514 is not completely buried in the hole 513 of the lower layer 510 and the cavity 513v is formed inside the hole 513, the silicon film 514 can be removed in a short period of time. In addition, a period of time during which a film surface on the side of the holes 513 and 523 is exposed to an etchant is short. Thus, damage to the film surface can be suppressed.

It should be noted that the embodiments disclosed herein are exemplary in all respects and are not restrictive. The above-described embodiments may be omitted, replaced or modified in various forms without departing from the scope and spirit of the appended claims.

Although the case where the substrate is a semiconductor wafer has been described as an example in the above embodiments, the present disclosure is not limited thereto. For example, the substrate may be a large substrate for flat panel display (FPD), or a substrate for EL element or solar cell.

According to the present disclosure in some embodiments, it is possible to selectively form a silicon film on an upper portion of a protruded portion.

What is claimed is:

1. A method of selectively forming a silicon film on an upper portion of each of a plurality of protruded portions formed on a substrate, the method comprising:
   a first film forming step of supplying a first silicon-containing gas to the substrate and forming a first silicon film so that a film thickness of the first silicon film becomes thicker in the upper portion of a sidewall of each of the plurality of protruded portions rather than in a lower portion of the sidewall of each of the plurality of protruded portions;
   an etching step of supplying an etching gas to the substrate and removing the first silicon film on the sidewall of each of the plurality of protruded portions while leaving the first silicon film on an upper surface of each of the plurality of protruded portions, the etching step being performed after the first film forming step; and
   a second film forming step of supplying a second silicon-containing gas to the substrate and forming a second silicon film so that a film thickness of the second silicon film becomes thicker in the upper portion of a sidewall of each of the plurality of protruded portions rather than in a lower portion of the sidewall of each of the plurality of protruded portions, the second film forming step being performed after the etching step,
   wherein the etching gas is a bromine-containing gas or an iodine-containing gas.

2. The method of claim 1, wherein the etching step comprises etching the first silicon film in a conformal manner.

3. The method of claim 1, wherein the first film forming step comprises forming the first silicon film so as not to close an opening formed between the protruded portions adjacent to each other.

4. The method of claim 1, wherein the second film forming step comprises forming the second silicon film so as not to close an opening formed between the protruded portions adjacent to each other.

5. The method of claim 1, further comprising: after performing the first film forming step once, alternately repeating the etching step and the second film forming step a predetermined number of times to form a third silicon film having a predetermined film thickness on the upper surface of each of the plurality of protruded portions.

6. The method of claim 1, wherein the second film forming step comprises forming the second silicon film so as to close an opening formed between the protruded portions adjacent to each other.

7. The method of claim 1, further comprising: forming a seed layer on each of the plurality of protruded portions by supplying an aminosilane-based gas to the substrate, that occurs before the first film forming step.

8. The method of claim 1, wherein the silicon-containing gas in the first film forming step is a high-order silane-based gas containing at least two silicon atoms in a molecular formula.

9. The method of claim 8, wherein the high-order silane-based gas is a disilane gas.

10. The method of claim 1, wherein the bromine-containing gas is an HBr gas or a Br$_2$ gas, and the iodine-containing gas is an HI gas or an I$_2$ gas.

11. The method of claim 1, wherein each of the plurality of protruded portions is a stacked film obtained by stacking silicon-containing films having different compositions one above another.

\* \* \* \* \*